United States Patent [19]
Danek et al.

[11] Patent Number: 6,155,198
[45] Date of Patent: *Dec. 5, 2000

[54] APPARATUS FOR CONSTRUCTING AN OXIDIZED FILM ON A SEMICONDUCTOR WAFER

[75] Inventors: Michael Danek, Cupertino; Marvin Liao, San Jose; Eric Englhardt, Palo Alto; Mei Chang, Saratoga; Yeh-Jen Kao, San Jose; Dale DuBois, Los Gatos; Alan F. Morrison, San Jose, all of Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/677,185

[22] Filed: Jul. 9, 1996

Related U.S. Application Data

[63] Continuation-in-part of application No. 08/498,990, Jul. 6, 1995, abandoned, which is a continuation-in-part of application No. 08/339,521, Nov. 14, 1994, abandoned, which is a continuation-in-part of application No. 08/567,461, Dec. 5, 1995, abandoned.

[51] Int. Cl.$^7$ .................................................. L23C 16/00
[52] U.S. Cl. ...................... 118/723 E; 118/725; 156/345
[58] Field of Search .................... 156/345; 118/723 E, 118/725

[56] References Cited

U.S. PATENT DOCUMENTS

| | | | |
|---|---|---|---|
| 4,173,661 | 11/1979 | Bourdon | 427/39 |
| 4,420,498 | 12/1983 | Hirose et al. | 427/39 |
| 4,480,010 | 10/1984 | Sasanuma et al. | 428/457 |

(List continued on next page.)

FOREIGN PATENT DOCUMENTS

| | | | |
|---|---|---|---|
| 0174743 | 3/1986 | European Pat. Off. | C23C 16/34 |
| 0 376 709 A2 | 7/1990 | European Pat. Off. | H01L 21/285 |
| 0 477 990 A2 | 4/1992 | European Pat. Off. | C23C 14/58 |
| 0 545 602 A1 | 6/1993 | European Pat. Off. | H01L 21/285 |
| 0 678 903 A1 | 10/1995 | European Pat. Off. | H01L 21/00 |
| 0 711 846 A1 | 5/1996 | European Pat. Off. | C23C 16/34 |
| 0 720 214 A2 | 7/1996 | European Pat. Off. | H01L 21/321 |
| 0 738 002 A2 | 10/1996 | European Pat. Off. | H01L 21/283 |

OTHER PUBLICATIONS

Park et al "A Novel Al–Reflow Process Using Surface Modificaion by the ECR Plasma Treatment and its Application to the 256Mbit DRAM" Semiconductor R & D Center, Samsung Electronics Co., pp. 109–112, Dec. 11, 1994.

"Thin–Film Deposition Principles and Practice" Author: Donald L. Smith; pp. 423–432, pp. 440–447,pp. 449–452, McGraw–Hill, Inc. Publishers, 1995. (*1).

Patent Abstracts of Japan vol. 015, No. 348, Sep. 4, 1991 citing Japaness application 03–135,018 to Hitachi.

Patent Abstracts of Japan vol. 016, No. 336, Jul. 21, 1992 citing Japaneses application 04–100,221 to Fujitsu.

Patent Abstracts of Japan vol. 015, No. 102, Mar. 12, 1991 citing Japaneses application 02–310,918 to Fujitsu.

Patent Abstracts of Japan vol. 009, No. 056, Mar. 12, 1985 citing Japaneses application 59–197,131 to Toshiba.

Patent Abstracts of Japan vol. 017, No. 693, Dec. 17, 1993 citing Japaneses application 5–230,639 to Oki Electric Inc.

*Primary Examiner*—Thi Dang
*Attorney, Agent, or Firm*—Thomason, Moser & Patterson

[57] ABSTRACT

The construction of a film on a wafer, which is placed in a processing chamber, may be carried out through the following steps. A layer of material is formed on the wafer, while the wafer is in the processing chamber. Next, the layer of material is oxidized, while the wafer is in the processing chamber. A semiconductor wafer processing chamber for carrying out such a construction in-situ may include a processing chamber, a showerhead, a wafer support and a rf signal means. The showerhead supplies gases into the processing chamber, while the wafer support supports a wafer in the processing chamber. The rf signal means is coupled to the showerhead and the wafer support for providing a first rf signal to the showerhead and a second rf signal to the wafer support.

15 Claims, 10 Drawing Sheets

U.S. PATENT DOCUMENTS

| | | | |
|---|---|---|---|
| 4,486,462 | 12/1984 | Asahi et al. | 427/39 |
| 4,619,748 | 10/1986 | Moll et al. | 204/192.31 |
| 4,683,149 | 7/1987 | Suzuki et al. | 427/38 |
| 4,740,385 | 4/1988 | Feuerstein et al. | 427/38 |
| 4,844,775 | 7/1989 | Keeble | 156/643 |
| 4,871,421 | 10/1989 | Ogle et al. | 156/643 |
| 4,874,494 | 10/1989 | Ohmi | 204/192.12 |
| 4,931,411 | 6/1990 | Tigelaar et al. | 437/192 |
| 4,965,090 | 10/1990 | Gärtner et al. | 427/39 |
| 4,985,372 | 1/1991 | Narita | 437/192 |
| 5,000,113 | 3/1991 | Wang et al. | 118/723 |
| 5,011,705 | 4/1991 | Tanaka | 427/39 |
| 5,017,403 | 5/1991 | Pang et al. | 427/39 |
| 5,053,245 | 10/1991 | Kiyama et al. | 427/38 |
| 5,057,185 | 10/1991 | Thomas, III et al. | 156/345 |
| 5,089,438 | 2/1992 | Katz | 437/184 |
| 5,246,881 | 9/1993 | Sandhu et al. | 437/192 |
| 5,250,328 | 10/1993 | Otto | 427/535 |
| 5,254,499 | 10/1993 | Sandhu et al. | 437/192 |
| 5,271,963 | 12/1993 | Eichman et al. | 427/248.1 |
| 5,273,783 | 12/1993 | Wanner | 427/250 |
| 5,283,085 | 2/1994 | Gärtner et al. | 427/534 |
| 5,314,603 | 5/1994 | Sugiyama et al. | 204/298.32 |
| 5,378,660 | 1/1995 | Ngan et al. | 437/247 |
| 5,480,684 | 1/1996 | Sandhu | 427/531 |
| 5,698,062 | 12/1997 | Sakamoto et al. | 156/345 |

| Film Thickness | Sheet Resistance | Sheet Resistance Uniformity Standard Deviation | Substrate Defects |
|---|---|---|---|
| 200 Å (No Oxidation) | 410 Ω/sq. | 2.2% | Severe |
| 300 Å (No Oxidation) | 235 Ω/sq. | 2.0% | Severe |
| 200 Å (20 Seconds Oxidation) | 630 Ω/sq. | 3.7% | Minor |
| 300 Å (20 Seconds Oxidation) | 250 Ω/sq. | 2.7% | None |

FIG. 9

APPARATUS FOR CONSTRUCTING AN OXIDIZED FILM ON A SEMICONDUCTOR WAFER

CROSS-REFERENCE TO RELATED APPLICATIONS

This application is a continuation-in-part of U.S. patent application Ser. No. 08/498,990, now abandoned, filed Jul. 6, 1995 and U.S. patent application Ser. No. 08/567,461 filed Dec. 5, 1995, now abandoned; both of which are a continuation-in-part of U.S. patent application 08/339,521, filed Nov. 14, 1994 now abandoned.

BACKGROUND OF THE INVENTION

1. Field of the Invention

The present invention is directed toward the field of manufacturing integrated circuits.

2. Description of the Related Art

When manufacturing integrated circuits, deposition processes are employed to deposit thin layers of insulative material and conductive material onto wafers. Deposition has been performed through various well known deposition processes, such as chemical vapor deposition ("CVD") and physical vapor deposition ("sputtering").

In a CVD process, a wafer is loaded into a chemical vapor deposition chamber. A vapor of a metallo-organic compound, such as tetrakis (dimethylamido) titanium (TDMAT), which has the formula $Ti(N(CH_3)_2)_4$, is loaded into the chamber and infused with energy. The energy is generated through such means as a thermal heat source, in the case of thermal CVD, or a radio frequency ("rf") signal source, in the case of plasma enhanced CVD. The energized chemical vapor reacts with the wafer's surface to form a thin layer of material on the wafer. When the TDMAT chemical vapor is used, a titanium nitride film is deposited on the wafer's surface.

In a sputtering process, a wafer is placed in a physical vapor deposition ("PVD") chamber, and the chamber is filled with a gas, such as argon. A plasma containing positively charged ions is created from the gas, by creating an electrical field in the chamber. The positively charged ions accelerate and collide into a target material, which is mounted in the chamber. Atoms of the target material are thereby separated from the target and deposited on the wafer to form a layer of target material on the surface of the wafer.

In order to enhance the bombardment of the target material by the positively charged ions in a traditional sputtering process, a negative bias may be provided to the target material. This is achieved by providing a radio frequency signal to an electrode that supports the target material. In order to facilitate the generation of the positively charged ions in a high density plasma PVD chamber, a separate rf signal may also be inductively coupled to the PVD chamber. In such a high density plasma PVD chamber, yet another rf signal may be provided to a pedestal that supports the wafer in the PVD chamber to improve attraction of the target material to the wafer.

A deposition chamber, such as a CVD chamber or a PVD chamber, may be used to deposit diffusion barriers in an integrated circuit. Diffusion barriers are employed in integrated circuits to prevent diffusion of a contact metal, such as aluminum, into the active region of a semiconductor device built on a silicon substrate. Unlike an insulative layer of material, a diffusion barrier is employed where it is desirable to have a conductive path for current to flow between the contact metal and the active semiconductor region. For example, a diffusion barrier may be employed to overlie a silicon substrate at the base of a contact hole to prevent interdiffusion of a contact metal, which fills the contact hole, into the substrate.

A severe interdiffusion between a contact metal, such as aluminum, and a silicon substrate can begin to take place when the integrated circuit is heated to temperatures in excess of 450° C. If an interdiffusion is allowed to occur, the aluminum contact metal penetrates into the silicon substrate, thereby causing an open contact in the integrated circuit and rendering it defective.

FIG. 1 illustrates a diffusion barrier 100 that resides between a conductive region 105 of a silicon substrate 101 and a contact plug 102. A contact hole 103 is formed in an insulative layer of material 104, such as silicon dioxide, that overlies the substrate 101. The diffusion barrier 100 is ideally formed so that it is thin and substantially conforms to the contours of the surface of the contact hole 103.

If the diffusion barrier 100 is thin and highly conformal, the contact metal 102 is able to form a sufficiently conductive ohmic contact with the silicon substrate's conductive region 105. If the diffusion barrier 100 is too thick or poorly formed, as shown in FIG. 2, it will prevent the contact metal 102 from forming a sufficiently conductive ohmic contact with the substrate region 105. In FIG. 2, the poorly formed diffusion barrier 100 severely narrows the opening of the contact hole 103, which causes the contact metal 102 to form so that it does not reach the base of the contact hole 103, and a void 106 is created.

In order to ensure a good ohmic contact between the contact metal 102 and the substrate region 105, it is desirable for the resistance of the diffusion barrier 100 be minimal. Typically, a resistivity value of 1,000 $\mu\Omega$-cm or less is acceptable One material that has been successfully employed as a diffusion barrier is titanium nitride (TiN).

However, in some deposition processes, such as those using TDMAT, the resistivity of the titanium nitride barrier layer is high and unstable. This is partly because a significant fraction of the deposited barrier material is composed of a carbon (hydrocarbons, carbides, etc.) and because the titanium, a chemically reactive metal, may not be completely reacted in the film. Accordingly, it would be desirable to treat such a layer of barrier material with a post-deposition processing, so that its resistivity was reduced and stabilized.

In manufacturing an integrated circuit, it is desirable to perform successive steps of the manufacturing process, such as deposition and post-deposition processing, in the same chamber ("in-situ"). In-situ operations reduce the amount of contamination that a wafer is exposed to by decreasing the number of times that the wafer is required to be transferred between different pieces of manufacturing equipment. In-situ operations also lead to a reduction in the number of expensive pieces of manufacturing equipment that an integrated circuit manufacturer must purchase and maintain.

In the fabrication of integrated circuits, there has been an increased use of aluminum metalization processes operating at high temperatures, in excess of 450° C. This has made it desirable to have diffusion barriers with a greater ability to inhibit the diffusion of contact metals, such as aluminum. Traditionally, diffusion barriers have been made thicker, in order to accommodate such a desire. However, smaller geometries are also being employed in the fabrication of integrated circuits, thereby decreasing the dimensions of contact holes and making it desirable for diffusion barriers to become thinner and more conformal.

Accordingly, it would be desirable to be able to construct a highly conformal thin diffusion barrier with an increased ability to inhibit the diffusion of contact metals, such as aluminum Additionally, it is desirable for such a diffusion barrier to not have a resistance that is greatly increased over the resistance of traditional diffusion barriers. It would also be desirable to construct such a diffusion barrier in-situ.

SUMMARY OF THE INVENTION

An apparatus and method in accordance with the present invention provide for carrying out the in-situ construction of a highly conformal diffusion barrier, which increasingly impedes the diffusion of contact metals, such as aluminum, without significantly enlarging the thickness or resistance of the diffusion barrier beyond that of traditional diffusion barriers.

A semiconductor wafer processing apparatus, which enables practicing embodiments of the present invention, may include a processing chamber, a showerhead, a wafer support, and a rf signal means. The showerhead is adapted to supply gases in the processing chamber, while the wafer support provides for supporting a wafer in the processing chamber. The rf signal means is coupled to the showerhead and the wafer support for providing a first rf signal to the showerhead and a second rf signal to the wafer support. In one embodiment of the present invention, the semiconductor wafer processing apparatus is a chemical vapor deposition chamber.

When practicing an aspect of the present invention, a process may be carried out for constructing a film on a wafer. The wafer is placed in a processing chamber. A layer of material is formed on the wafer, while the wafer is in the processing chamber. Next, the layer of material is oxidized, while the wafer is in the processing chamber. The formation of the layer of material on the wafer may be carried out by a variety of means, including physical vapor deposition, chemical vapor deposition, and a process of repeated thermal chemical vapor deposition and annealing.

BRIEF DESCRIPTION OF THE DRAWINGS

Further details of the present invention are explained with the help of the attached drawings in which:

FIG. 9 illustrates the resistance characteristics of diffusion barriers that are formed in accordance with one embodiment of the process illustrated in FIG. 5

DETAILED DESCRIPTION OF THE PREFERRED EMBODIMENTS

Figure 1:
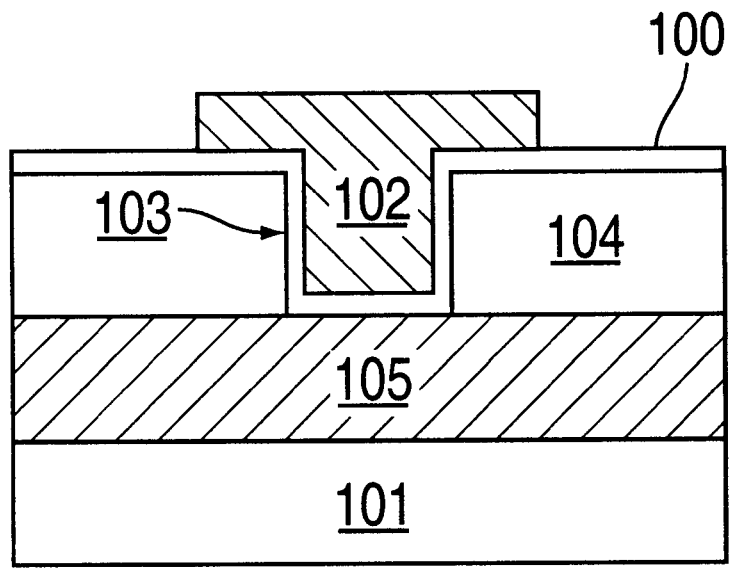
FIG. 1 illustrates a contact plug in an integrated circuit, which includes a diffusion barrier.
Figure 2:
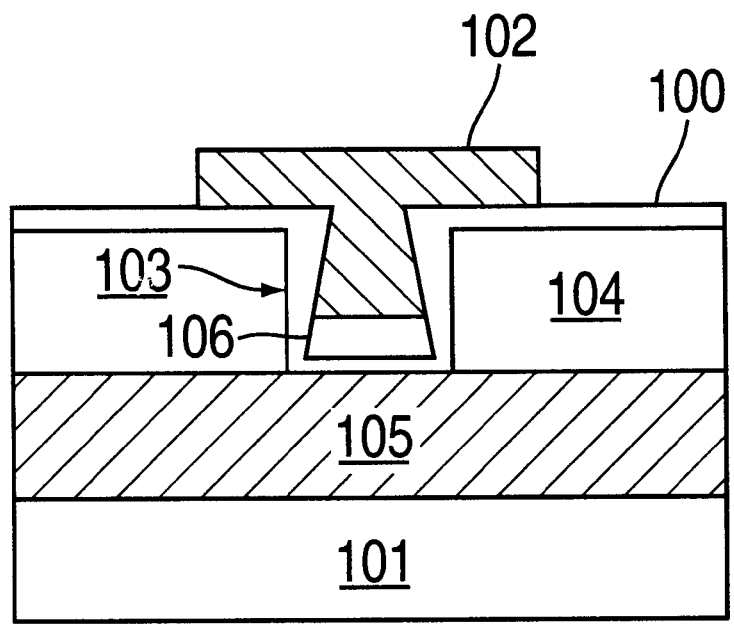
FIG. 2 illustrates a contact hole in an integrated circuit that is obstructed by a diffusion barrier.
Figure 3:
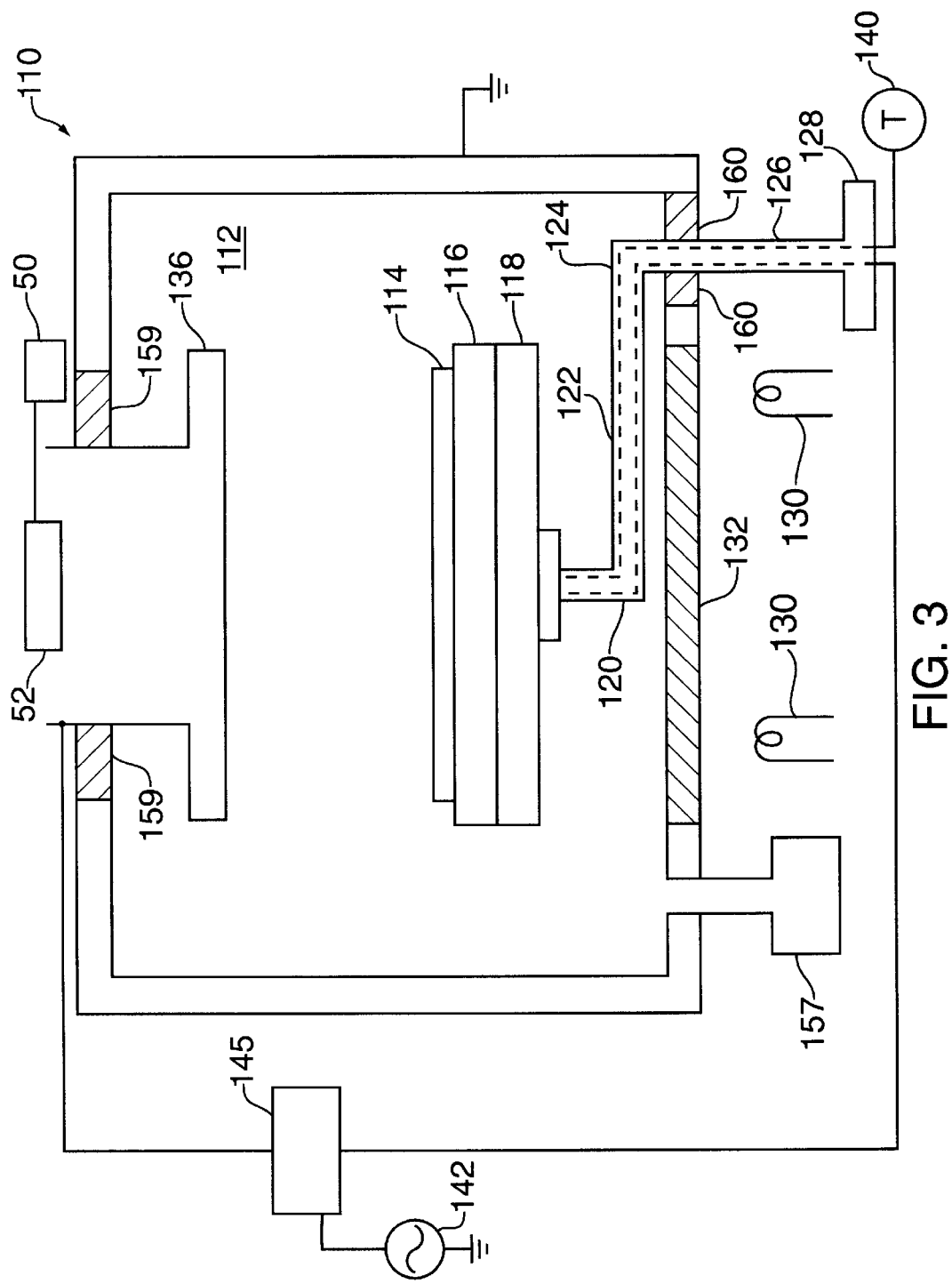
FIG. 3 illustrates one embodiment of a semiconductor wafer processing chamber in accordance with the present invention

FIG. 3 illustrates a semiconductor wafer processing chamber 110, which incorporates one embodiment of the present invention, that provides for performing a series of in-situ deposition and post-deposition processing steps on a semiconductor wafer 114. In accordance with the present invention, the chamber 110 depicted in FIG. 3 is a chemical vapor deposition chamber and is described in detail in U.S. patent application Ser. No. 08/567,461.

As shown in FIG. 3, the semiconductor wafer processing chamber 110 includes a processing chamber 112, which is coupled to ground. A semiconductor wafer 114 may be supported in this chamber on a wafer support 116. The wafer support 116 may be a susceptor, a pedestal, a resistive heater, or any other suitable means for supporting the wafer 114.

In FIG. 3, the wafer support 116 is a susceptor, which is the type of wafer support that is often used when lamps are used to irradiate the wafer support 116. The susceptor is made of anodized aluminum and is supported by a conventional alumina ceramic support plate 118. The combination of the support plate 118, wafer support 116 and wafer 114 is supported on a free end 120 of a cantilevered alumina support arm 122. A fixed end 124 of the support arm 122 is mounted to a generally vertically moveable stem 126, which is electrically isolated from the processing chamber by isolator 160. The vertically moveable stem 126 is vertically displacable under action of a displacement mechanism 128.

The processing chamber 112 and its contents are heated by means of conventional lamps 130, which irradiate the wafer support 116 through a conventional quartz window 132. The semiconductor wafer processing chamber 110 further includes a temperature determination means 140, which is coupled to the wafer support 116 to sense the temperature of the wafer support 116. A vacuum pump, pressure gauge and pressure regulator valve are all included in a pressure control unit 157. The pressure control unit 157 adjusts the pressure in the processing chamber 112 and exhausts both carrier gases and reaction by-products from the processing chamber 112.

A showerhead 136 is placed above the wafer support 116 in the processing chamber 112 and is electrically isolated from the chamber 112 by means of isolator 159. The showerhead 136 is supplied with processing gases from a gas panel 52. The gas panel 52 is controlled by a gas panel controller 50 in the form of a computer.

During a deposition process, the gas panel controller 50 causes the gas panel 52 to supply a CVD process gas, such as TDMAT, to the showerhead 136. Through the showerhead 136, the process gas is introduced into the processing chamber 112 and transported to the heated wafer 114. As a result, a thin film of material deposits on the upper surface of the wafer 114.

During a post-deposition process that is performed in the semiconductor wafer processing chamber 110, plasma annealing and oxidation are performed, as will be described below. During a plasma annealing process, a plasma gas, such as a combination of nitrogen, hydrogen, and argon, is supplied to the showerhead 136 by the gas panel 52 under control of the gas panel controller 50. During a post-deposition oxidation process, an oxygen based gas, such as $O_2$ or a $N_2/O_2$ mixture is supplied to the showerhead 136 by the gas panel 52 under control of the gas panel controller 50. The post-deposition plasma annealing provides for increased stability of the deposited thin film of material, while the post-deposition oxidation enhances the thin film's ability to impede the diffusion of contact metals, such as aluminum.

In both the plasma annealing process and the oxidation process, the gas supplied by the showerhead 136 is transformed into a plasma containing positively charged ions that react with the wafer 114. Any carrier gas that is employed during either the deposition or post-deposition processing, as well as any by-products from the deposition, plasma annealing, or oxidation, are exhausted from the processing chamber 112 by means of the pressure control unit 157.

In order to perform the above-mentioned post-deposition plasma generations, the semiconductor wafer processing chamber 110 includes a rf source 142 for applying rf power to the showerhead 136, which operates as a first electrode, and the wafer support 116, which operates as a second electrode. The rf source 142 may be capable of providing signals with frequencies less than 1 MHz, and preferably providing signals with a frequency of 350 KHz. The means for providing rf signals to two electrodes in embodiments of the present invention overcomes challenges relating to the biasing of the two electrodes that are not present in providing rf signals to two electrodes in other traditional semiconductor wafer processing chambers, such as a PVD chamber.

In embodiments of the present invention, it is generally undesirable to provide a great deal of negative bias to the showerhead 136, since this can result in excessive ion collision with the showerhead 136 and the generation of contaminant particles. On the contrary, in a traditional PVD chamber it is desirable for an electrode supporting the target to be given significant negative bias, so that ions readily collide with the target material.

Although the negative biasing of the wafer support 116 and temperature control of the wafer 114 in a traditional sputtering process are typically not critical, this is not true in embodiments of the present invention. In embodiments of the present invention, an rf source may be responsible for both controlling negative bias on the wafer support 116 and providing energy for the generation of plasma. Controlling negative bias on the wafer support 116 is desirable for establishing ion flux towards the wafer 114. Also, accurately setting the temperature of the wafer 114 is desirable when performing both deposition and post-deposition processing. The wafer support 116 provides the dual function of being coupled to an rf signal, for providing a negative bias to the wafer support 116, and housing a sensing mechanism (not shown) through which the temperature determination means 140 can monitor the temperature of the wafer support 116. In order to perform this dual function, the wafer support 116 is designed to isolate the rf signal from the temperature sensing mechanism. A detailed description of the design of the wafer support 116 is provided in U.S. patent application Ser. No. 08/498,990.

In accordance with the present invention, the rf source 142 is coupled to the wafer support 116 and the showerhead 136 through a matching network 145. The matching network 145 is a resistor/inductor/capacitor network. The matching network 145 matches the load impedance to the source impedance, in order to maximize the power delivered by the source at a given frequency. The matching network 145 also splits rf power between the wafer support 116 and the showerhead 136 and sets the phase shift of the rf signals provided to the showerhead 136 and the wafer support 116.

Figure 4A:
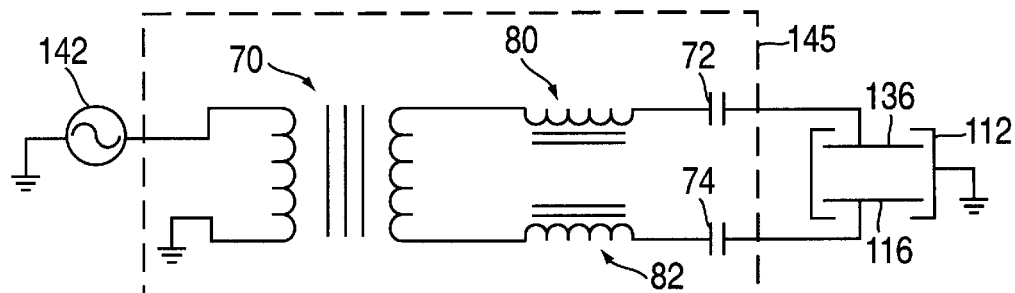
FIGS. 4A–4C illustrate embodiments of the matching network that is shown in FIG. 3.

A matching network 145 used in one embodiment of the present invention is illustrated in FIG. 4A, in which the matching network 145 includes a load match transformer 70, two inductors 80 and 82, and two capacitors 72 and 74. The load match transformer 70 is coupled at one end to the rf source 142 and ground, and on another end to the inductors 80 and 82. The inductors 80 and 82 are coupled to the showerhead 136 and wafer support 116, respectively, through capacitors 72 and 74, respectively. The load match transformer 70 may have a primary to secondary turns ratio ranging from 1:1 to 1:4, with 1:1.22 being typical. In accordance with the present invention, the primary coil of the load match transformer 70 may have 18 turns, and the secondary coil of the load match transformer 70 may have 47 turns, while inductors 80 and 82 each have an inductance of 50 $\mu$H, and the capacitors 72 and 74 each have a capacitance of 0.01 $\mu$F.

Figure 4B:
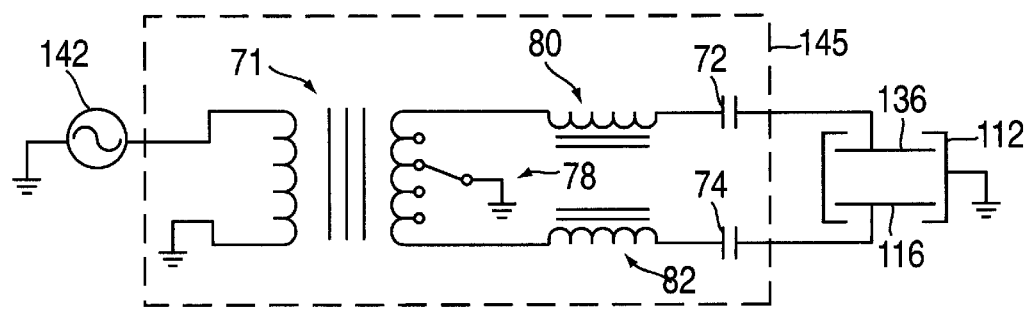

The power split and the phase shift between the rf signals at the showerhead 136 and wafer support 116 may be changed by modifying the turns ratio of the load match transformer 70. Alternatively, as shown in FIG. 4B, a load match transformer 71 may have a selectable ground tap 78, which allows for the selection of variable ground tap positions to change the power split and phase shift between the rf signals at the showerhead 136 and the wafer support 116.

Figure 4C:
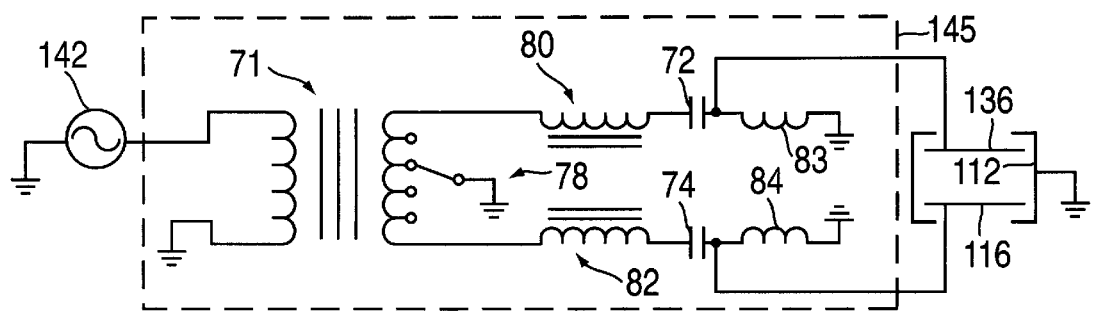

In yet another embodiment of the matching network 145, as shown in FIG. 4C, capacitor 72 and the showerhead 136 are both coupled to ground through an inductive choke 83, and capacitor 74 and the wafer support 116 are both coupled to ground through an inductive choke 84. Inductive choke 83 and inductive choke 84 may each have a value of 500 $\mu$H. When such an embodiment is employed, the showerhead 136 and the wafer support 116 do not become DC biased Providing for plasma annealing and oxidation by coupling both the showerhead 136 and the wafer support 116 to the rf source 142 through the matching network 145 is advantageous. Controlling the phase shift between the rf signals at the showerhead 136 and the wafer support 116, so that they are out of phase, provides for enhancing the uniformity of the plasma generated during post-deposition processing. An out of phase relationship between the showerhead 136 and the wafer support 116 signals causes the ions in the plasma, including oxygen ions during the post-deposition oxidation process, to be more attracted to the wafer support 116 than the grounded processing chamber 112. The out of phase relationship increases the voltage potential between the showerhead 136 and the wafer support 116, thereby enhancing the uniformity of the ion flux towards the wafer 114.

By providing for the power split of the signals at the showerhead 136 and the wafer support 116 to be adjusted, in addition to the phase shift, the matching network 145 enables the intensity of ion bombardment of the wafer 114 and the showerhead 136 to be controlled. Excessive negative biasing of the wafer support 116, during plasma generation, tends to cause ions to generally increase their acceleration towards the wafer 114, thereby bombarding the wafer 114 with such energy that the wafer 114 becomes damaged. Excessive negative biasing of the showerhead 136, during plasma generation, tends to cause ions to bombard the showerhead 136 and create contaminant particles. The ability to set the power split of the signal from the rf source 145 enables the negative bias of the showerhead 136 and the negative bias of the wafer support 116 to be selected so as to minimize the aforementioned contamination and damaging wafer bombardment.

In accordance with the present invention, the matching network 145 may be configured to supply rf signals to the wafer support 116 and the showerhead 136 that have the same power and frequency, but are 180 degrees out of phase. This efficiently couples rf power to the showerhead 136 and the wafer support 116 for transforming gases in the processing chamber 112 into plasma.

Embodiments of an rf split power configuration may be seen by reference to U.S. Pat. No. 5,314,603, entitled PLASMA PROCESSING APPARATUS CAPABLE OF DETECTING AND REGULATING ACTUAL RF POWER AT ELECTRODE WITHIN CHAMBER and issued to Sugiyama, et al., or to U.S. Pat. No. 4,871,421, entitled SPLIT-PHASE DRIVER FOR PLASMA ETCH SYSTEM and issued to Ogle, et al.

The semiconductor wafer processing chamber shown in FIG. 3 may be employed to carry out a number of processes. In a further aspect of the invention, a process for forming a diffusion barrier is provided. It will be recognized that the process of the present invention may be advantageously performed in the aforementioned apparatus. However, it should be further recognized that the method may be performed in any number of suitable chambers.

Figure 5:
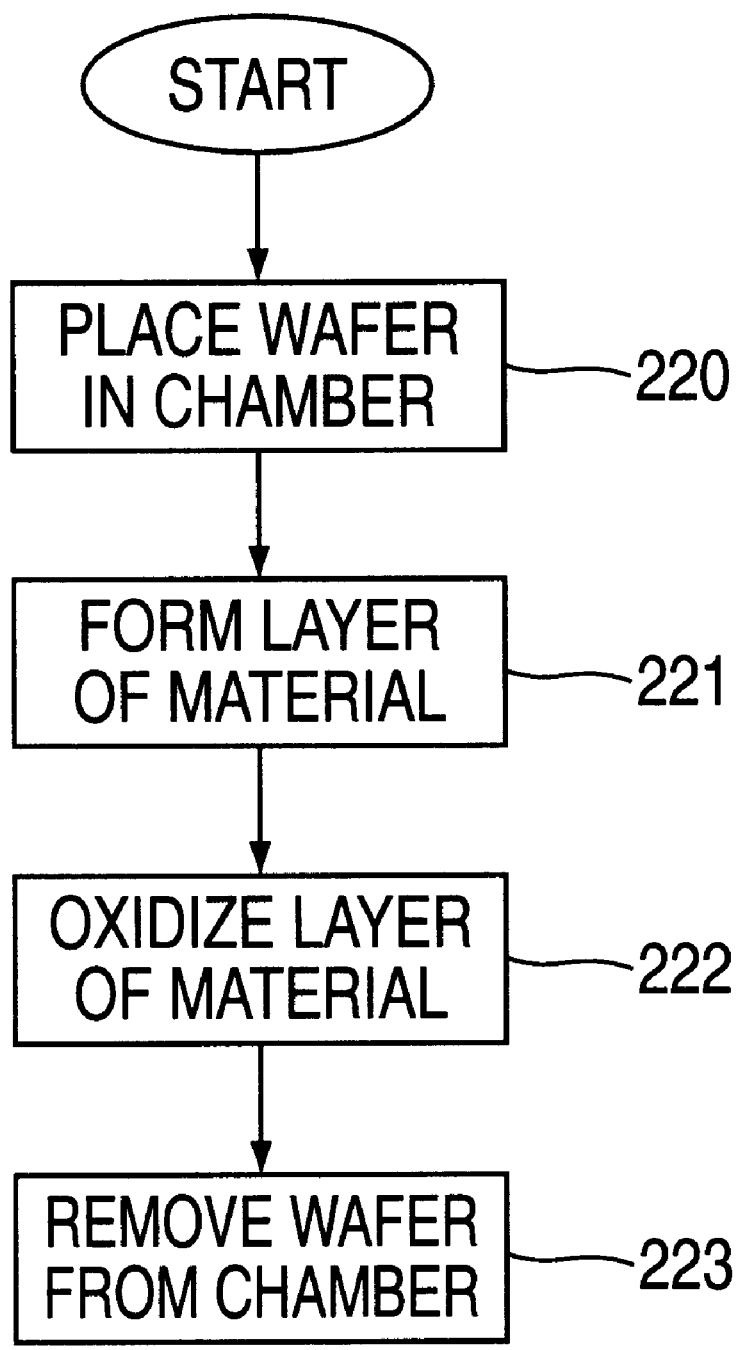
FIG. 5 illustrates a flow diagram of a process for forming a diffusion barrier that incorporates one embodiment of the present invention.

FIG. 5 illustrates a process in accordance with the present invention for constructing a film in an integrated circuit. A diffusion barrier is one film that may be constructed by performing the process illustrated in FIG. 5. However, other films that are intended to inhibit the diffusion of contact metals, such as aluminum, may also be constructed in accordance with the process in FIG. 5. In step 220, a wafer 114 is placed in a processing chamber, such as the processing chamber 112 that is shown in the semiconductor wafer processing chamber 110 in FIG. 3.

In step 221, a layer of material is formed on an upper surface of the wafer 114 in-situ (i.e. without the wafer being removed from the processing chamber 112 at anytime during the formation step 221). In one embodiment of the present invention, step 221 is performed by a deposition and subsequent plasma annealing of a layer of material in the processing chamber 112.

Figure 6A:
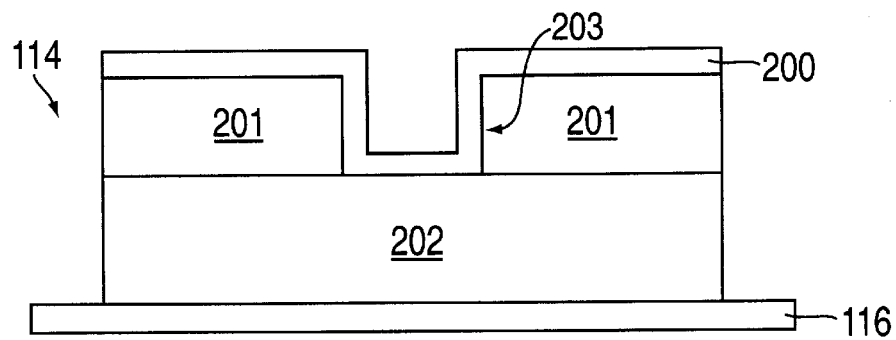
FIGS. 6A–6E illustrate a cross-sectional view of a partially formed integrated circuit on a wafer on which a diffusion barrier is being formed in accordance with one embodiment of the process illustrated in FIG. 5.

FIG. 6A depicts the wafer 114 after deposition of the layer of material 200. FIG. 6A shows the layer of material 200 deposited over a wafer 114 supported by the wafer support 116. The wafer 114 includes a substrate 202, which may be comprised of silicon, and an overlying layer of insulative material 201, such as silicon dioxide, that has a contact hole 203 formed therein to expose a portion of the substrate 202.

The layer of material 200 is deposited on the upper surface of the wafer 114 using a thermal CVD process, so that the material 200 conforms to the surface of the insulative layer of material 201 and the exposed surface of the substrate 202. During the deposition, the pressure control unit 157 may set the pressure in the processing chamber between 0.6 to 1.2 Torr, and the lamps 130 may set the temperature of the wafer 114 to be between 360 to 380° C.

In one embodiment of the present invention, the deposited material 200 may be a barrier material, such as a binary metal nitride, like titanium nitride (TiN). In the case of a titanium nitride layer of barrier material 200, a TDMAT processing gas may be used. In an alternate embodiment of the present invention, a ternary metal silicon nitride may be used as the barrier material 200, instead of a binary metal nitride. The deposited material may have a thickness of between 50 and 300 angstroms, preferably being between 50 and 100 angstroms.

Figure 6B:
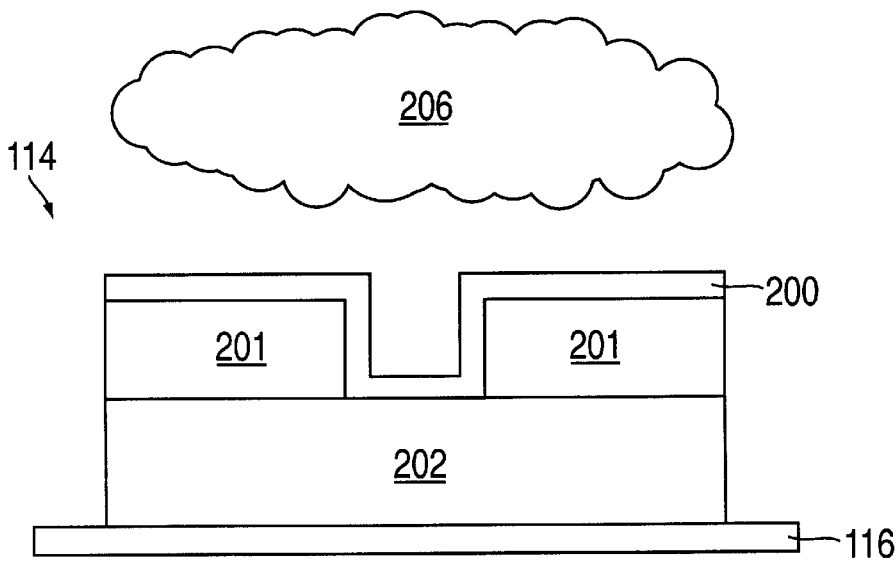
Figure 6C:
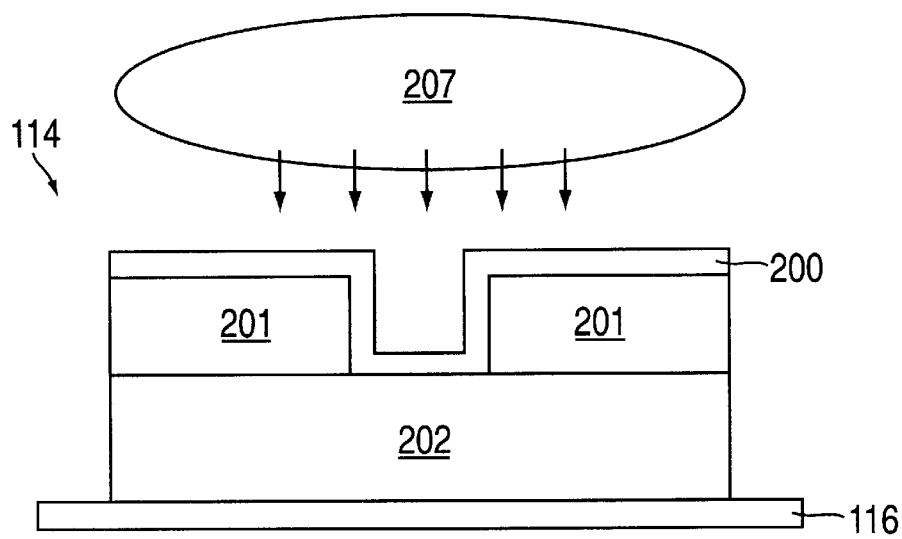

Once the layer of barrier material 200 is deposited, it is annealed through a process of ion bombardment. FIGS. 6B and 6C show the wafer 114, during the ion bombardment process While residing on the wafer support 116, the wafer 114 may be about 0.3 to 0.8 inches from the showerhead 136. Preferably, the wafer 114 is between 0.6 and 0.7 inches from the showerhead 136.

As shown in FIG. 6B, the ion bombardment is achieved by first transferring a gas 206 into the processing chamber 112 via the showerhead 136. In one embodiment of the present invention, the gas 206 is a mixture of nitrogen and hydrogen having a 2:3 nitrogen to hydrogen ratio and being introduced into the processing chamber 112 with a nitrogen flow rate of approximately 400 sccm. The pressure in the processing chamber 112 is set to approximately 1.0 Torr., and the wafer temperature is set to be between 300 and 400° C. and preferably is 360° C. In an alternate embodiment of the present invention, the gas 206 may be comprised of a gas having a nitrogen to hydrogen ratio between 3:1 and 1:2. Gases containing other combinations of nitrogen, hydrogen, and argon may also be used.

Next in the ion bombardment process, the rf source 142 supplies a signal to the showerhead 136 and the wafer support 116 causing the gas 206 to form a plasma 207 containing positively charged ions, as shown in FIG. 6C. The rf source 142 may supply 350 watts of rf power at 350 KHz, through the matching network 145, to produce rf signals to the showerhead 136 and wafer support 116 that are 180 degrees out of phase. Typically, the plasma 207 is maintained for 10 to 30 seconds. The rf source 142 may alternatively supply 350 watts of rf power at a different frequency below 1 MHz.

The repeated cycling of voltage from the rf source 142 results in a surplus of electrons in the vicinity of the wafer 114 that produces a negative bias at the wafer 114. Further, the wafer support 116 may acquire a negative bias between −100 to −400 volts, typically −300 volts, while the showerhead 136 may acquire a negative bias between −100 to −400 volts, typically −200 volts. The processing chamber 112 is grounded, and the negative bias of the wafer 114 is between −100 to −400 volts, typically −300 volts, which remains approximately constant during the period of ion bombardment.

During the ion bombardment, the positively charged ions from the plasma 207 are accelerated by the voltage gradient into the surface of the wafer 114 and penetrate the surface of the wafer to a depth between 50 to 200 angstroms. Energetic neutral atomic particles from the plasma 207 may also bombard the wafer 114.

The ion bombardment causes the thickness of the deposited layer of barrier material 200 to be reduced by 20% to 50% depending on the temperature of the substrate 202 and the plasma treatment time and energy. In order to form a diffusion barrier layer having a desirable thickness, such as between 150 to 300 angstroms, the above described CVD deposition and ion bombardment processes are repeated using layers of barrier material between 50 to 100 angstroms thick.

Alternatively, step 221 may be carried out by a number of different means U.S. patent application Ser. No. 08/339,521, entitled IMPROVED TITANIUM NITRIDE LAYERS DEPOSITED BY CHEMICAL VAPOR DEPOSITION AND METHOD OF MAKING, U.S. patent application Ser. No. 08/498,990, entitled BIASED PLASMA ANNEALING OF THIN FILMS, and U.S. patent application Ser. No. 08/567,461, entitled PLASMA ANNEALING OF THIN FILMS, each disclose a process for forming a layer of barrier material on an upper surface of a wafer through the use of a CVD process and plasma annealing. Each of the processes disclosed by these applications may be employed in embodiments of the present invention to perform the operation of step 221. Each of these applications is hereby incorporated by reference.

In one embodiment of the present invention, the wafer is placed in an apparatus that can perform physical vapor deposition, and the layer of material is formed by a conventional sputtering process. In an alternate embodiment of the present invention, the wafer is placed in a chamber that can perform chemical vapor deposition, and the layer of material is formed through a CVD process, without additional plasma annealing.

In the manufacture of integrated circuits, aluminum is frequently employed as a contact metal. Since aluminum has an affinity for oxygen, the diffusivity of aluminum may be reduced in oxygen rich materials. Therefore, the layer of material 200 formed in step 221 can be processed to act as an enhanced diffusion barrier to an aluminum contact metal by infusing the material 200 with oxygen.

In step 222, the layer of material formed in step 221 is oxidized in-situ (i.e. without being removed from the processing chamber 112 after step 221 is performed, until step 222 is completed). The oxidation in step 222 is performed so that the grain boundaries of the material 200 become oxidized, while the material's grains themselves experience very little oxidation.

The oxidation of the material's grain boundaries may be achieved in-situ through the use of the semiconductor wafer processing chamber 110 shown in FIG. 3. Once the layer of material 200 is formed in accordance with step 221, the wafer 114 remains in the processing chamber 112, and the pressure control unit 157 sets the pressure in the processing chamber 112 to be between 0.5 and 1.0 Torr. The wafer 114 temperature is set to be between 300 and 400° C., and is preferably 360° C.

Figure 6D:
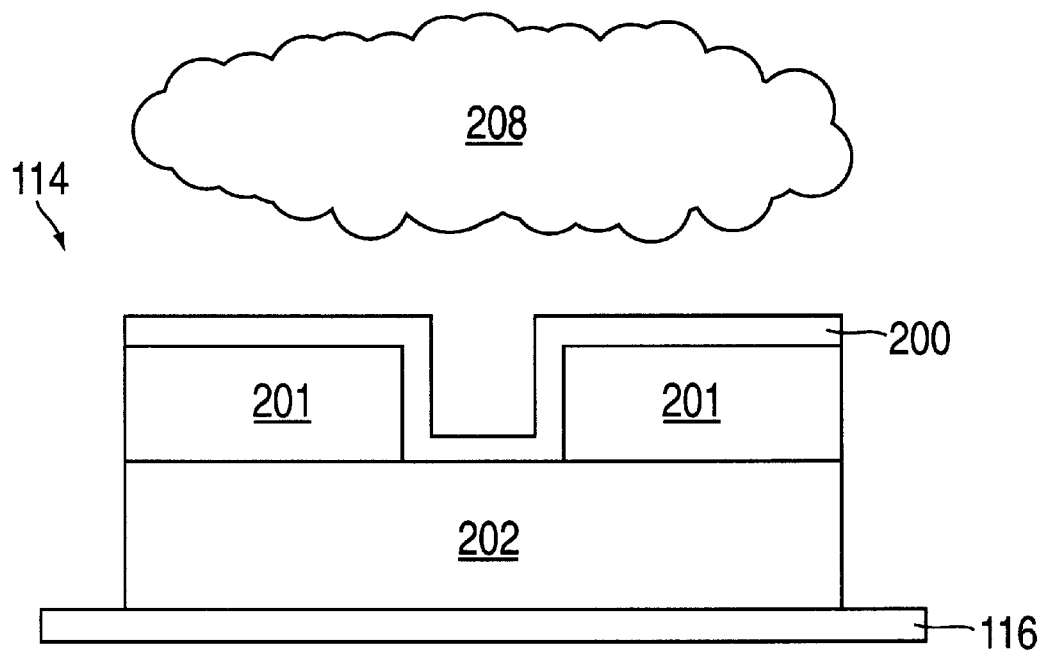
Figure 6E:
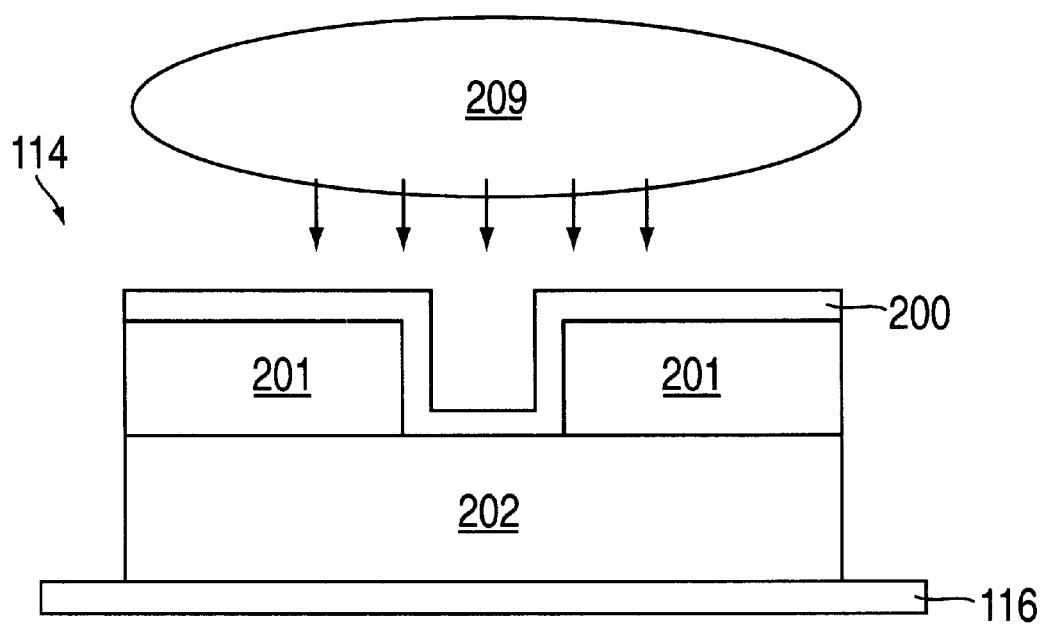

As shown in FIG. 6D, the layer of material 200 is exposed to an oxygen bearing gas 208, such as a $N_2/O_2$ mixture or $O_2$. The gas 208 is transferred into the processing chamber 112 through the showerhead 136 at a flow rate between 100–1000 sccm. The gas 208 may include both nitrogen and oxygen and have a mixture ratio of nitrogen to oxygen of 4:1. Next, the rf source 142 supplies a signal through the matching network 145 to both the wafer support 116 and the showerhead 136 to convert the gas 208 into a plasma 209 containing positively charged oxygen ions, as shown in FIG. 6E.

The rf source 142 supplies 350 watts of rf power at 350 KHZ through the matching network 145 for approximately 20 seconds to produce rf signals at the showerhead 136 and the wafer support 116 that are 180 degrees out of phase. The showerhead 136, wafer support 116 and wafer 114 each acquire a negative bias, as described above for the annealing process. As a result, the positively charged oxygen ions accelerate toward the wafer 114 and penetrate the surface of the layer of material 200 and attach to the grain boundaries of the material 200.

Once this oxidation is completed in one embodiment of the present invention, the oxidized layer of material 200 is oxidized titanium nitride, which is able to operate as an enhanced diffusion barrier to contact metals that have an affinity for oxygen, such as aluminum. Alternatively, an enhanced diffusion barrier is also formed in accordance with the present invention, when the layer of material 200 is another binary metal nitride or a ternary metal silicon nitride.

In an alternate embodiment of the present invention, the same semiconductor wafer processing chamber 110 is employed to perform a thermal oxidation process in step 222. An oxygen bearing gas, such as oxygen, ozone, air or water, is transferred into the processing chamber 112 via the showerhead 136 at a flow rate between 100 and 1000 sccm. The lamps 130 then heat the wafer 114 to a temperature between 300 and 400° C., while the pressure in the processing chamber is set to be between 0.5 and 1000 Torr., and is preferably 1.0 Torr. As a result, oxygen in the oxygen bearing gas penetrates the surface of the layer of barrier material 200 and attaches to the grain boundaries of the barrier material 200. One process for oxidizing a barrier material's grain boundaries is disclosed in U.S. Pat. No. 5,378,660, entitled BARRIER LAYERS AND ALUMINUM CONTACTS and issued to Ngan, et al.

Once the layer of material 200 is formed and oxidized, as specified in steps 221 and 222, respectively, the wafer 114 is removed from the processing chamber 112 in step 223.

Although the execution of the process illustrated in FIG. 5 has been specifically described to be performed in the semiconductor wafer processing chamber 110 in FIG. 3, the process is not restricted to being performed in chamber 110. The process depicted in FIG. 5 may be carried out in any semiconductor wafer processing chamber that provides for carrying out the in-situ wafer processing steps 220–223 in accordance with the present invention.

Figure 7:
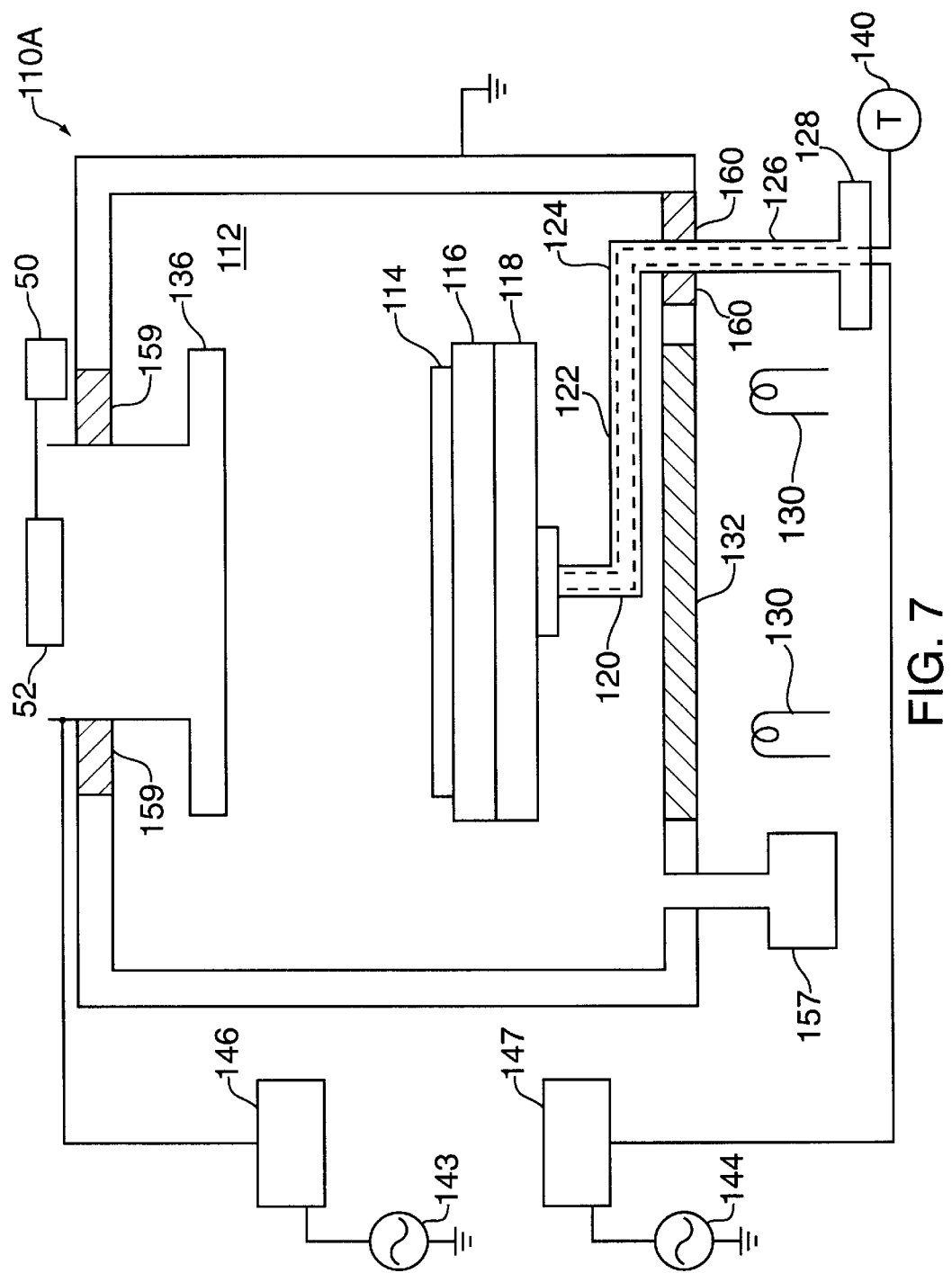
FIG. 7 illustrates an alternate embodiment of a semiconductor wafer processing chamber in accordance with the present invention.

FIG. 7 illustrates a semiconductor wafer processing chamber 110A that incorporates an alternate embodiment of the present invention that is capable of carrying out the in-situ process illustrated in FIG. 5. The semiconductor wafer processing chamber 110A chamber in FIG. 7 is the same as the chamber 110 depicted in FIG. 3, except that the showerhead 136 and the wafer support 116 in chamber 110A are each coupled to a different rf source 143 and 144, respectively. Rf source 143 is coupled to the showerhead 136 through matching box 146, and rf source 144 is coupled to the wafer support 116 through matching box 147.

The matching boxes 146 and 147 each use conventional means for matching the load impedance of the showerhead 136 and wafer support 116, respectively, to the source impedance, in order to maximize the power delivered by the source at a given frequency. Preferably, the rf sources 143 and 144 are coupled together (not shown) to provide for controlling the phase shift and power split between the rf signal provided to the showerhead 136 and the rf signal provided to the wafer support 116. In accordance with the present invention, the matching networks 146 and 147 and rf sources 143 and 144 may be configured to supply rf signals to the wafer support 116 and the showerhead 136 that have the same power and frequency, but are 180 degrees out of phase.

In yet another embodiment of the present invention, the wafer support 116 may be a resistive heater. The resistive heater supports the wafer 114 and incorporates a resistive coil for heating the wafer 114.

Figure 8A:
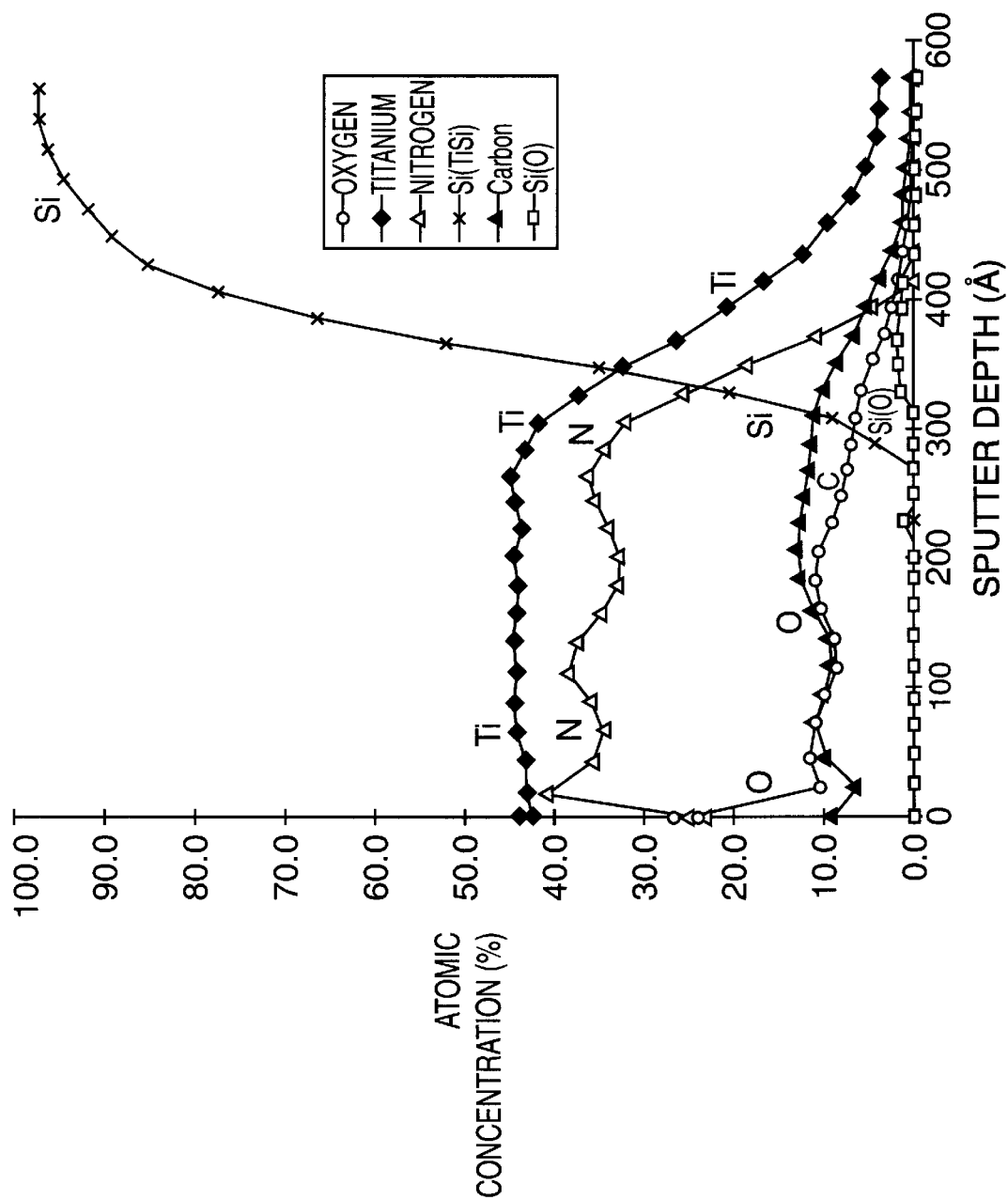
FIGS. 8A and 8B illustrate the chemical composition of non-oxidized and oxidized diffusion barriers, respectively, that are formed in accordance with the process illustrated in FIG. 5.
Figure 8B:
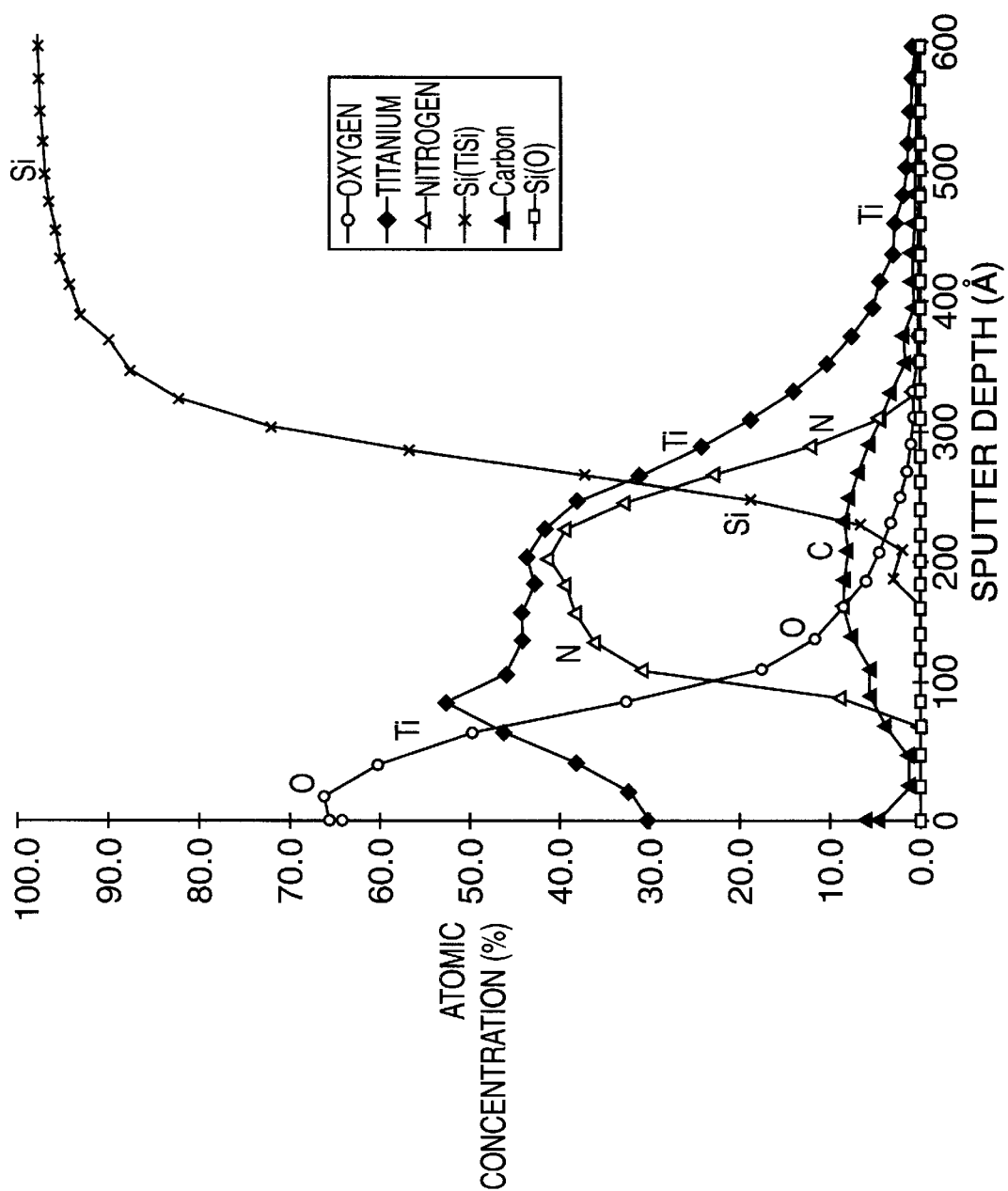

Traditionally, diffusion barriers have been made thicker to provide greater protection against the diffusion of contact metals. As a result of embodiments of the present invention, diffusion barriers do not have to be made thicker to inhibit the diffusion of contact metals In embodiments of the present invention, the oxidation of the barrier material reduces the diffusivity of contact metals, such as aluminum, with an affinity for oxygen. As such contact metals begin to diffuse into an oxidized layer of barrier material, such as titanium nitride, the contact metals bond with the oxygen ions that are attached to the grain boundaries of the barrier material. As a result, the contact metals are unable to reach the region underlying the diffusion barrier The chart in FIG. 8A shows the chemical composition at different depths of a wafer, after a layer of barrier material has been deposited and plasma annealed in accordance with the present invention, but not oxidized. FIG. 8B includes a chart that shows the chemical composition at different depths of a wafer, after a layer of barrier material has been deposited, plasma annealed, and oxidized in accordance with the present invention.

Each of these charts represents data that was taken from a wafer having a silicon substrate overlaid by a barrier layer of titanium nitride. The wafer was probed by Auger Electron Spectroscopy. Each chart shows the atomic concentration of different chemicals in the wafer at different depths of the wafer As can be seen by comparing the two charts, the oxygen level in the top portion of the wafer, which constitutes the barrier material, is significantly higher in the oxidized barrier material (FIG. 8B) than in the non-oxidized barrier material (FIG. 8A). The presence of the oxygen in the barrier material causes a contact metal, such as aluminum, to have its diffusivity greatly decreased, by bonding with the oxygen ions in the barrier material. Accordingly, the oxidized barrier material (FIG. 8B) provides a better diffusion barrier between a contact metal, such as aluminum, and an underlying silicon substrate than does the non-oxidized barrier material (FIG. 8A).

Additionally, the sheet resistances of diffusion barriers formed by embodiments of the present invention are not unacceptably compromised by the oxidation process in step 222. FIG. 9 shows a table that illustrates this fact. As shown in the table, a 200 angstrom layer of titanium nitride barrier material, which is deposited and plasma annealed in accordance with the present invention, but not oxidized, may have a sheet resistance of 410 Ω/sq. and a sheet resistance uniformity standard deviation of 2.2%. The resulting resistivity of such a layer of barrier material is 820 $\mu\Omega$-cm. A 200 angstrom layer of titanium nitride barrier material, which is deposited, plasma annealed, and oxidized for 20 seconds in accordance with the present invention, may have a sheet resistance of only 630 Ω/sq. and a sheet resistance uniformity standard deviation of 3.7%. The resulting resistivity of such a layer of barrier material is 1260 $\mu\Omega$-cm.

The table is FIG. 9 also shows the sheet resistances for a 300 angstrom layer of titanium nitride barrier material. After being deposited and plasma annealed in accordance with the present invention, the 300 angstrom layer of titanium nitride barrier material may have a sheet resistance of 235 Ω/sq. and a sheet resistance uniformity standard deviation of 2.0%. After deposition, plasma annealing, and oxidation for 20 seconds in accordance with the present invention, the 300 angstrom layer of titanium nitride barrier material may have a sheet resistance of 250 Ω/sq. and a sheet resistance uniformity standard deviation of 2.7%. Accordingly, the non-oxidized 300 angstrom layer of barrier material may have a resistivity of 705 $\mu\Omega$-cm, while the oxidized 300 angstrom layer of barrier material may have a resistivity of only 750 $\mu\Omega$-cm.

The relative effectiveness of the non-oxidized and oxidized layers of titanium nitride barrier material that appear in the table in FIG. 9 were evaluated as follows. A 1,000 angstrom layer of aluminum was deposited on wafers having upper surfaces comprised of either the non-oxidized or the oxidized layers of titanium nitride barrier material. After being deposited on the wafers, the aluminum was annealed in a furnace for one hour at 550° C. Wafers having the 200 angstrom and 300 angstrom layers of titanium nitride barrier material, which was not oxidized, experienced severe defects from diffusion of the aluminum into the wafer's substrate. Wafers having the 200 angstrom and 300 angstrom layers of titanium nitride barrier material, which was deposited, plasma annealed and oxidized in accordance with the present invention, suffered only minor defects or no defects, respectively, from the diffusion of aluminum.

The data in FIGS. 8A, 8B and 9 is only one possible set of results that can be achieved from practicing embodiments of the present invention. The results set forth in these figures are in no way meant to limit embodiments of the present invention to achieving the same or substantially the same results Although the present invention has been described in terms of specific exemplary embodiments, it will be appreciated that various modifications and alterations might be made by those skilled in the art without departing from the spirit and scope of the invention as specified in the following claims

What is claimed is:

1. Apparatus for depositing and enhancing a nitride film on a semiconductor wafer comprising:
    a process chamber;
    a showerhead positioned within said process chamber;
    a gas source connected to said showerhead, said gas source comprising a nitride film-forming process gas containing a metallo-organic precursor and an oxidation gas;
    a wafer support positioned within said process chamber;
    a heater positioned proximate said wafer support, wherein said heater supplies sufficient energy to said wafer support to decompose said metallo-organic precursor and deposit said nitride film;
    a first RF source coupled to said showerhead; and
    a second RF source coupled to said wafer support, wherein said first and second RF sources couple RF energy respectively to said showerhead and said wafer support to produce an oxidation plasma from said oxidation gas, whereby said deposited nitride film is oxidized within said process chamber.

2. The apparatus of claim 1 wherein said gas source further comprises a plasma annealing gas; and said first and second RF sources couple RF energy respectively to said showerhead and said wafer support to produce an annealing plasma.

3. The apparatus of claim 2 wherein said annealing gas comprises a mixture of nitrogen and hydrogen.

4. The apparatus of claim 2 wherein said process gas deposits a film of titanium nitride upon a semiconductor wafer.

5. The apparatus of claim 2, wherein said apparatus performs said depositing, oxidizing and annealing of said nitride film in-situ.

6. The apparatus of claim 2, wherein said plasma annealing gas comprises combinations of gases selected from the group of nitrogen, hydrogen, and argon.

7. The apparatus of claim 2, wherein said plasma annealing gas comprises nitrogen and hydrogen having a nitrogen to hydrogen ratio between 3:1 and 1:2.

8. The apparatus of claim 1 wherein said first RF source produces a first RF signal and said second RF source produces said second RF signal, where said first and second RF sources are 180 degrees out of phase.

9. The apparatus of claim 1 wherein said first and second RF sources further comprise:

a single RF source; and an RF power splitter.

10. The apparatus of claim 1 wherein the metallo-organic precursor is tetrakis(dimethylamido) titanium (TDMAT).

11. The apparatus of claim 1 wherein said oxidation gas contains oxygen.

12. The apparatus of claim 1, wherein said wafer support is maintained at a temperature of between about 300–400° C.

13. The apparatus of claim 1, wherein said oxidation gas is selected from the group of oxygen, ozone, water and air.

14. The apparatus of claim 1, wherein said heater is operable in the absence of a plasma.

15. The apparatus of claim 1, wherein said heater is operable with a plasma.

\* \* \* \* \*